United States Patent [19]

Lynch et al.

[11] Patent Number: 5,248,585
[45] Date of Patent: Sep. 28, 1993

[54] POLYPHOSPHAZENE BINDER RESINS FOR PHOTORSISTS COMPRISING AS PHOTOSENSITIZERS O-QUINONE DIAZIDE ESTERS

[75] Inventors: Thomas J. Lynch, Sharon, Mass.; Dana L. Durham, E. Greenwich; Chester Sobodacha, Coventry, both of R.I.

[73] Assignee: Hoechst Celanese Corporation, Somerville, N.J.

[21] Appl. No.: 810,634

[22] Filed: Dec. 18, 1991

[51] Int. Cl.$^5$ .................. G03F 7/023; G03F 7/32; G03C 1/73
[52] U.S. Cl. .................. 430/326; 430/165; 430/191; 430/192; 430/193; 430/270; 430/272; 430/330; 430/905; 528/168; 528/399
[58] Field of Search .............. 430/270, 326, 330, 191, 430/192, 193, 296, 272, 905, 942, 197, 165, 167; 528/399, 168

[56] References Cited

U.S. PATENT DOCUMENTS

| | | | |
|---|---|---|---|
| 4,446,295 | 5/1984 | Shibuta et al. | 528/399 |
| 4,925,772 | 5/1990 | Quella et al. | 430/281 |
| 4,935,481 | 6/1990 | Vaahs | 528/28 |
| 4,959,442 | 9/1990 | Ohkawa et al. | 528/399 |
| 4,968,582 | 11/1990 | Tranjan et al. | 430/270 |
| 5,041,524 | 8/1991 | Gleria et al. | 528/169 |

FOREIGN PATENT DOCUMENTS

| | | |
|---|---|---|
| 0369398 | 11/1989 | European Pat. Off. . |
| 0368165 | 5/1990 | European Pat. Off. . |
| 0210357 | 7/1987 | Japan . |

OTHER PUBLICATIONS

"Aryloxy-poly(phosphazenes) as negative-working, oxygen reactive ion etching resistant materials" by H. Hiraoka and K. N. Chiong, Jun. 9, 1986.

"Carboxylic Acid, Ester, and Lithium Carboxylate Derivatives of Poly(methylphenylphosphazene)" by P. Wisian-Neilson, Macromolecules, vol. 22, No. 11, 1989.

"Poly(alkyl/arylphosphazenes) and their Precursors" by R. H. Neilson and P. Wisian-Neilson, Chem. Rev. 1988, 88, pp. 541-562.

"ESCA and Mass Spectroscopic Studies of Degradations of Poly[bis(trifluoroethoxy)phosphazene]: Pyrolysis, Ultraviolet Light, and Electron Beam Induced Degradations" by H. Hiraoka, W. Lee, L. W. Welsh, Jr. and R. W. Allen, Macromolecules, vol. 12, No. 4, Jul.-Aug. 1979.

Primary Examiner—Charles L. Bowers, Jr.
Assistant Examiner—John S. Chu
Attorney, Agent, or Firm—Andrew F. Sayko, Jr.

[57] ABSTRACT

This invention relates to novel radiation sensitive compositions. More particularly the invention relates to photoresists containing phosphorus and nitrogen linked polymers; i.e., polyphosphazenes, useful in the preparation of a relief pattern on a substrate; e.g., a silicon wafer or aluminum plate. The polyphosphazenes of in this invention can be synthesized by the condensation of N-trimethylsilylalkoxyphosphorimides. Radiation sensitive positive photoresist compositions of the invention can be developed in aqueous base developer or organic solvent developer The base developer dissolution properties of the composition can be controlled by incorporating carboxylate groups into the polyphosphazene. The polyphosphazenes utilized in this invention have good solubility properties in various organic solvents and also have good mechanical, electrical, adhesion and thermal properties.

10 Claims, No Drawings

POLYPHOSPHAZENE BINDER RESINS FOR PHOTORSISTS COMPRISING AS PHOTOSENSITIZERS O-QUINONE DIAZIDE ESTERS

BACKGROUND OF THE INVENTION

This invention relates to polyphosphazenes and to the synthesis of photosensitive compositions useful for etch resistant applications.

Photosensitive compositions and their use as photoresists are well known. Generally positive photoresists compositions are prepared from alkali-soluble, phenol-formaldehyde novolak resins and light or radiation sensitive o-quinone diazides or naphthoquinone diazides. Examples of positive-working photoresists are described in U.S. Pat. Nos. 3,666,473; 4,115,128; and 4,173,470.

Conventional novolak resists have limited etch stability and are not particularly well suited for modern dry etch processes and applications. The advantages of positive photoresists over negative photoresists are also known in the art, such as higher resolution and exposure time stability in the presence of oxygen.

In the industrial application of photoresists the polymeric component and the radiation sensitive component (photosensitizer) are dissolved in an organic solvent or mixture of solvents and applied as a thin film or coating to a substrate suitable for the production of semiconductor devices such as computer chips and integrated circuits.

The polymeric binder resin component of these resist formulations is a film forming material which, for positive photoresists, is desirably soluble in aqueous alkaline solutions, but the photosensitizer acts as a dissolution rate inhibitor with respect to the binder resin. Upon exposure of selected areas of the coated substrate to actinic radiation, the photosensitizer undergoes a radiation induced structural transformation and the exposed areas of the coating are rendered more soluble than the unexposed areas. This difference in solubility rates causes the exposed areas of the positive photoresist coating to be dissolved when the substrate is treated with a developing solution, leaving the unexposed areas substantially intact, thus producing a positive relief pattern on the substrate.

In most applications, the exposed and developed substrate will be subjected to treatment by a substrate-etchant solution. The photoresist coating protects the coated areas of the substrate from the etchant and, thus, the etchant is only able to etch the uncoated areas of the substrate. In the case of a positive photoresist this corresponds to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of the photoresist on the substrate produced by the method described above is useful for various applications including, for example, as an exposure mask or a pattern such as is employed in the manufacture of miniaturized integrated electronic components or the manufacture of a printing plate.

The properties of a photoresist composition which are important in commercial practice include the solubility of the resist in the application solvent, the photospeed of the resist, development contrast, solubility in an environmently acceptable developer solution, adhesion, dimensional stability at elevated temperature, abrasion resistance, and etch resistance.

Photospeed is important for a photoresist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, high, controlled photospeed is particularly important for a photoresist composition employed in processes where a number of multiple exposures must be made to produce a mask or series of circuit patterns on a substrate. Control of the photospeed is extremely important in order to produce high resolution relief patterns in microcircuitry; e.g., a photospeed which is too high can result in narrowing the range of acceptable processing conditions.

Photoresist resolution refers to the capability of a photoresist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a photoresist is required to provide a high degree of resolution for very small line and space widths.

The ability of a photoresist to reproduce very small dimensions of less than one micron, is extremely important in the production of large scale integrated circuits on silicon chips and similar components. Circuit density on such a chip can be increased, assuming photolithography techniques are utilized, by increasing the resolution capabilities of the resist Various attempts have been made in the prior art to produce etch resistant positive resists possessing the above desired properties. To date, imagable polyphosphazene resist systems have not been successfully utilized in positive photosensitive compositions. The exceptionally high temperature resistance and flame retardant properties of polyphosphazenes have made them useful as finishes in the fabric industry.

The goal of numerous development programs has been the development of a simple, reliable and cost effective radiation sensitive polymer system that could be used with common photolithographic equipment and processes. However, the silicon-containing polymers which were developed have been plagued by poor shelf life, extraordinarily low photospeed and excessive post-development/post-cure structure contraction. The contraction of original structures upon cure was as much as 60 percent. Although materials based on this chemistry have yielded high resolution structures, they required exposures of ten minutes or longer. Shelf life was also notoriously short, particularly in the high concentrated solutions required for thick film applications.

SUMMARY OF THE INVENTION

The present invention relates to polyphosphazenes useful in radiation sensitive compositions; such as an alkali soluble polyphosphazene and a quinone diazide type or onium salt photosensitizer. Etch resistant relief patterns with good resolution and adhesion properties can be made from the radiation-sensitive compositions of the present invention.

This invention particularly relates to polyphosphazene-based photosensitive compositions. Polyphosphazenes are typically prepared by methods known in the prior art, such as the deprotonation of methyl substituents of poly(methylphenylphosphazene) followed by reaction of the resulting ion with an electrophile. (See *Carboxylic Acid, Ester, and Lithium Carboxylate Derivatives of Poly(methylphenylphosphazene)*; Patty Wisian-Neilson, M. Safiqul Islam, S. Ganapathiappan, Devri L. Scott, Krishan S Raghuveer and Randal R. Ford; Macromolecules 1989, 22, pp. 4382–4384, incorporation herein by reference).

This invention provides a unique photoresist composition, a method for making a photoresist composition of predetermined solvent solubility and photospeed and a method for producing semiconductor devices using such a photoresist composition. Solvent solubility, photospeed and base developability of the polyphosphazene can be controlled by the loading of the carboxylate groups which can range from >10 to <60 percent, preferably from about 15 to 50 percent Positive photoresists of the present invention, after coating and exposure in the conventional manner, can be developed in alkaline aqueous resist developer to provide fine structured relief structures suitable for use in microelectronic and printing applications. The photospeed of the photoresist can be tailored to suit the particular application at hand. These photoresists have high thermal stability (250°–350° C.), good photospeed, good solubility in the commonly used coating solvents and good adhesion. The photoresist formulations of the present invention can be stored, without gel formation, for an extended period of time at room temperature, without affecting the photospeed or viscosity of the formulations.

The present invention provides a photoresist composition comprising:

a) a film forming polyphosphazene binder resin having the general formula

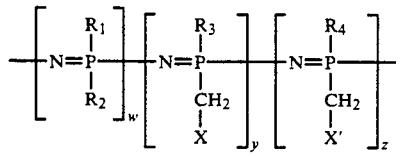

where $R_1$, $R_2$, $R_3$ and $R_4$ are each independently H; halogen; —OH; alkyl preferably containing 1 to 10 carbon atoms such as methyl, ethyl, propyl, butyl, pentyl, hexyl; cycloalkyl, such as cyclohexyl; a mononuclear to trinuclear substituted or unsubstituted aromatic group; aralkyl; alkenyl; haloalkyl or styryl. X and X' may be: 1) $R_1$, $R_2$, $R_3$ and $R_4$ groups; 2) $R_1$, $R_2$, $R_3$ and $R_4$ groups containing carboxyl moieties such as —COOH, —COOM (M=metal) and —COOR (where R is $R_1$, $R_2$, $R_3$ and $R_4$ as defined above); 3) $C_1$ to $C_{10}$ alkyl groups or monophenyl to triphenyl aryl groups containing —OH; w, y and z are each independently equal to from 0 to 100 percent where w+y+z=100 percent;

b) a photosensitizer which is substantially free of a halogen;

c) a suitable solvent.

The present invention also provides a method for producing a photoresist composition by providing an admixture comprising:

a) a film forming polyphosphazene binder resin having the general formula:

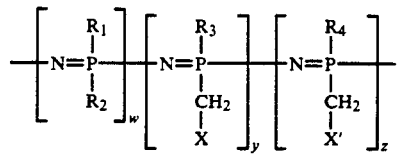

where $R_1$, $R_2$, $R_3$ and $R_4$ are each independently H; halogen; —OH; alkyl preferably containing 1 to 10 carbon atoms such as methyl, ethyl, propyl, butyl, pentyl, hexyl; cycloalkyl, such as cyclohexyl; a mononuclear to trinuclear substituted or unsubstituted aromatic group; aralkyl; alkenyl; haloalkyl or styryl. X and X' may be: 1) $R_1$, $R_2$, $R_3$ and $R_4$ groups; 2) $R_1$, $R_2$, $R_3$ and $R_4$ groups containing carboxyl moieties such as —COOH, —COOM (M=metal) and —COOR (where R is $R_1$, $R_2$, $R_3$ and $R_4$ as defined above); 3) $C_1$ to $C_{10}$ alkyl groups or monophenyl to triphenyl aryl groups containing —OH; w, y and z are each independently equal to from 0 to 100 percent where w+y+z=100 percent;

b) a photosensitizer which is substantially free of a halogen; and c) a suitable solvent.

The present invention further provides a method for producing a semiconductor device by producing a photo-image on a substrate by coating a suitable substrate with a photoresist composition comprising:

a) providing an admixture of:

1) a film forming polyphosphazene binder resin having the general formula:

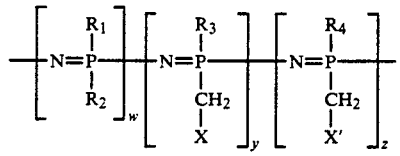

where $R_1$, $R_2$, $R_3$ and $R_4$ are each independently H; halogen; —OH; alkyl preferably containing 1 to 10 carbon atoms such as methyl, ethyl, propyl, butyl, pentyl, hexyl; cycloalkyl, such as cyclohexyl; a mononuclear to trinuclear substituted or unsubstituted aromatic group; aralkyl; alkenyl; haloalkyl or styryl. X and X' may be: 1) $R_1$, $R_2$, $R_3$ and $R_4$ groups; 2) $R_1$, $R_2$ $R_3$ and $R_4$ groups containing carboxyl moieties such as —COOH, —COOM (M=metal) and —COOR (where R is $R_1$, $R_2$, $R_3$ and $R_4$ as defined above); 3) $C_1$ to $C_{10}$ alkyl groups or monophenyl to triphenyl aryl groups containing—OH; w, y and z are each independently equal to from 0 to 100 percent where w+y+z=100 percent;

2) a photosensitizer which is substantially free of a halogen;

3) a suitable solvent;

b) coating a suitable substrate with said admixture; and c) heat treating the coated substrate until substantially all of the solvent is removed; image-wise exposing the photoresist composition and removing the image-wise exposed areas of such composition with a suitable developer.

DESCRIPTION OF THE PREFERRED EMBODIMENTS

The present invention relates to film-forming binder resins comprising: linear carboxylate-containing polyphosphazene polymers useful in photosensitive compositions, such as photoresists, which have the following general formula

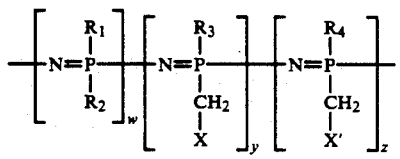

where $R_1$, $R_2$, $R_3$ and $R_4$ are each independently H; halogen; —OH; alkyl preferably containing 1 to 10 carbon atoms such as methyl, ethyl, propyl, butyl, pentyl, hexyl; cycloalkyl, such as cyclohexyl; a mononuclear to trinuclear substituted or unsubstituted aromatic group; aralkyl; alkenyl; haloalkyl or styryl. X and X' may be: 1) $R_1$, $R_2$, $R_3$ or $R_4$ groups; 2) $R_1$, $R_2$, $R_3$ or $R_4$ groups containing carboxyl moieties such as —COOH, —COOM (M=metal) and —COOR (where R is $R_1$, $R_2$, $R_3$ or $R_4$ as defined above); 3) $C_1$ to $C_{10}$ alkyl groups or monophenyl to triphenyl aryl groups containing —OH. The w, y and z are each independently equal to from 0 to 100 percent where $w+y+z=100$ percent. Preferably, y and z are each independently equal to from 10 to 90 percent and w is from 10 to 90 percent.

The polyphosphazenes of the present invention are useful in the preparation of novel photoresist compositions. These photoresist compositions comprise a polyphosphazene binder resin, as heretofore described, and a radiation or light sensitizer. The polyphosphazene and sensitizer are dissolved in a suitable solvent to provide a photoresist which can then be applied to the desired substrate in the production of semiconductor devices.

Similarly, the use of a radiation sensitizer such as o-quinone diazides is well known in the art, as disclosed in Light Sensitive Systems, Kosar, J.: John Wiley & Sons, New York, 1965 in Chapter 7.4, which is incorporated herein by reference. Radiation sensitizers which comprise a component of the photoresist compositions of the present invention are preferably selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride and naphthoquinone-(1,2)-diazide-4-sulfonyl chloride condensed with phenolic compounds such as hydroxy benzophenones.

In general, any non-halogen containing radiation sensitive compound or composition may be used with the polyphosphazenes of the present invention provided that 1) the compound or composition has a developer solubility inhibiting effect on the polyphosphazene and 2) the compound or composition upon exposure to actinic radiation is directly or indirectly converted into smaller molecules which results in increased or decreased solubility, tackiness or volatility in the exposed area. Because of their negative effect on people and the environment, halogen-containing photosensitizers are avoided. Examples of such radiation sensitive compounds or compositions are disclosed in U.S. Pat. No. 4,247,611 and 4,619,998; the teachings of which are hereby incorporated by reference.

The present invention provides a process for producing a photoresist composition and a process for producing semiconductor devices using such a photoresist composition. The photoresist composition is preferably positive working and is formed by providing an admixture of a non-halogen containing photosensitizer; the water insoluble, aqueous polyphosphazene resin of the present invention and a suitable solvent. Suitable solvents may include propylene glycol mono-alkyl ether, propylene glycol alkyl (e.g. methyl) ether acetate, ethyl-3-ethoxypropionate, ethyl lactate, mixtures of ethyl-3-ethoxypropionate ethyl lactate, butyl acetate, xylene, diglyme, ethylene glycol monoethyl ether acetate. The preferred solvents are propylene glycol methyl ether acetate and ethyl-3-ethoxypropionate.

A suitable substrate is coated with the resulting photoresist composition. The coated substrate is heat treated until substantially all of the solvent is removed; the photoresist composition is image-wise exposed; and the image-wise exposed areas of the photoresist composition is removed with a suitable developer.

Other optional ingredients such as colorants, dyes, antistriation agents, leveling agents, plasticizers, adhesion promoters, speed enhancers, solvents and such surfactants as nonionic surfactants may be added to the solution of polyphosphazene resin, sensitizer and solvent before the solution is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of resin and sensitizer. The dye additives help provide increased resolution by inhibiting back scattering of light off the substrate.

Anti-striation agents may be used at up to about a five percent weight level, based on the combined weight of resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of resin and sensitizer The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of resin and sensitizer. Development speed enhancers that may be used include, for example, picric acid, nicotinic acid or nitrocinnamic acid up to about a 20 percent weight level, based on the combined weight of resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of resin and sensitizer.

The prepared photoresist solution, can be applied to a suitable substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures, gallium arsenide, indium phosphide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes in a convection oven.

Exposed positive photoresist-coated substrates are developed to remove the image-wise exposed areas by immersion in an alkaline developing solution or developed by a spray development process. The solution is preferably agitated, for example, by nitrogen burst agitation. The substrates are allowed to remain in the developer until all, or substantially all, of the positive photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point In industrial applications, particularly in the manufacture of microcircuitry units on silicon/silicon dioxide-type substrates, the developed substrates may be treated with a buffered, hydrofluoric acid base etching solution The photoresist compositions of the present invention are resistant to acid-base etching solutions and provide effective protection for the unexposed photoresist-coating areas of the substrate The following specific examples will provide detailed illustrations of the methods of producing and utilizing compositions of the present invention. These examples are not intended, however, to limit or restrict the scope of the invention in any way and should not be construed as providing conditions, parameters of values which must be utilized exclusively in order to practice the present invention.

EXAMPLE 1

A photoresist formulation was prepared by mixing 20 percent by weight polyphosphazene on which 50 percent of the methyl groups were carboxylated, with 5 percent by weight tricyclodecanedimethylol-2,1,5-diazo ester and 75 percent by weight diglyme. The solution was filtered then spin-cast onto silicon wafers at 3000 rpm for 30 seconds The wafers were baked in a convection oven for 30 minutes at 90° C. giving 1.4 $\mu$m thick films The films were exposed to 100 millijoules/cm$^2$ of broadband radiation centered at 405 nm through an Ealing Test pattern mask.

The wafers were then immersed in an aqueous 0.05N tetramethylammonium carbonate solution for 21 seconds. Positive images were developed resolving features down to 4 $\mu$m.

EXAMPLE 2

A second photoresist formulation was prepared as above but with a different photosensitizer, the 85% 2,1,5- 15% 2,1,4-diazo ester of 2,3,4-trihydroxy benzophenone. This formulation gave 1.4 $\mu$m films on silicon wafers after a 30 minute 90° C. oven bake. The films were exposed to 50 millijoules/cm$^2$ broadband radiation monitored at 405 nm and then developed in 0.05N tetramethylammonium carbonate for 15 seconds. Positive features were 8 $\mu$m.

EXAMPLE 3

The procedure of Example 2 was repeated except that the partial (45%) ester of 2,3,5-trihydroxybenzophenone and 2,1,5-diazo sulfonyl chloride was used as the photosensitizer. A 0.8 μm film was deposited on a 4 inch silicon wafer. The coated wafer was exposed to 50 mj/cm.$^2$ of broadband radiation centered at 405 nm and developed in 0.05 N tetramethyl ammonium carbonate for 10 seconds Positive images were obtained down to 8 μm.

EXAMPLE 4

A phosphazene polymer with 25 percent of the methyl units functionalized with —COOH groups was used in a photoresist formulation. Twenty percent by weight of this polymer was dissolved in 75 percent by weight of diglyme and 5 percent by weight of the diazonaphthoquinone photosensitizer of Example 2. This formulation spin-cast on silicon wafers at 1200 rpm for 30 seconds then baked at 90° C. for 30 minutes to give 1.0 μm thick films. Coated wafers were exposed to 50 millijoules/cm$^2$ of broadband radiation monitored at 405 nm and developed in 0.2N aqueous tetramethylammonium carbonate solution for 30 seconds. Positive images down to 4 μm lines and spaces were resolved with negligible dark film loss.

We claim:

1. A method for producing a photo-image on a substrate by coating a substrate with a photoresist composition comprising:
   a) providing an admixture of:
      1) a film forming polyphosphazene binder resin having the general formula:

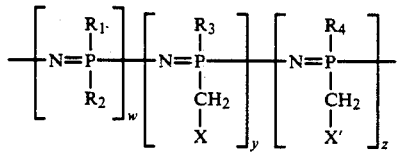

where $R_1$, $R_2$, $R_3$ and $R_4$ are each independently H; halogen; —OH; alkyl preferably containing 1 to 10 carbon atoms such as methyl, ethyl, propyl, butyl, pentyl, hexyl; cycloalkyl, such as cyclohexyl; a mononuclear to trinuclear substituted or unsubstituted aromatic group; aralkyl; alkenyl; haloalkyl or styryl. X and X' may be: 1) $R_1$, $R_2$, $R_3$ or $R_4$ groups; 2) $R_1$, $R_2$, $R_3$ or $R_4$ groups containing carboxyl moieties such as —COOH, —COOM (M=metal) and —COOR (where R is $R_1$, $R_2$, $R_3$ or $R_4$ as defined above); 3) $C_1$ to $C_{10}$ alkyl groups or monophenyl to triphenyl aryl groups containing—OH. The w, y and z are each independently equal to from 0 to 100 percent where w+y+z=100 percent;
   2) a photosensitizer free of a halogen substituent in the compound structure; and
   3) a solvent;
   b) coating a substrate with said admixture; and
   c) heat treating the coated substrate to remove the solvent; image-wise exposing the photoresist composition and removing the image-wise exposed areas of such composition with a developer.

2. The method of claim 1 wherein y and z are each independently equal to form 0 to 90 percent and w is equal to from 10 to 90 percent.

3. The method of claim 1 wherein from lo to 60 percent of the total of the $R_1$, $R_2$, $R_3$ and $R_4$ groups contain carboxyl groups.

4. The method of claim 1 wherein from 15 to 50 percent of the total of the $R_1$, $R_2$, $R_3$ and $R_4$ groups contain carboxyl groups 5. The method of claim 1 where the photoresist composition has a thermal stability of from 250° to 350° C.

6. The method of claim 1 wherein the polyphosphazene resin is a derivative of the methyl substituent of poly(methylphenylphosphazene).

7. The method of claim 1 wherein the photosensitizer is a substituted naphthoquinone diazide.

8. The method of claim 1 wherein the solvent is selected from the group consisting of: propylene glycol mono-alkyl ether, propylene glycol alkyl ether acetate, ethyl-3-ethoxypropionate, ethyl lactate, butyl acetate, xylene, diglyme, ethylene glycol methyl ether acetate.

9. The method of claim 1 wherein the solvent is either propylene glycol methyl ether acetate or ethyl-3-ethoxy propionate.

10. The method of claim 1 further comprising the step of baking the coated substrate immediately before or after the removing step.

* * * * *